(12) United States Patent
Kim et al.

(10) Patent No.: US 11,305,614 B2
(45) Date of Patent: Apr. 19, 2022

(54) SYSTEM FOR COOLING STORAGE DEVICE AND SMART VEHICLE INCLUDING THE SAME

(71) Applicant: SK hynix Inc., Gyeonggi-do (KR)

(72) Inventors: Myoung Seo Kim, Gyeonggi-do (KR); Seung Yong Lee, Gyeonggi-do (KR); Young Pyo Joo, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 363 days.

(21) Appl. No.: 16/513,335

(22) Filed: Jul. 16, 2019

(65) Prior Publication Data

US 2020/0114730 A1    Apr. 16, 2020

(30) Foreign Application Priority Data

Oct. 11, 2018 (KR) .................. 10-2018-0120871

(51) Int. Cl.
| | |
|---|---|
| *B60H 1/24* | (2006.01) |
| *G06F 1/20* | (2006.01) |
| *H05K 7/20* | (2006.01) |
| *B60H 1/00* | (2006.01) |

(52) U.S. Cl.
CPC ......... *B60H 1/245* (2013.01); *B60H 1/00785* (2013.01); *G06F 1/206* (2013.01); *H05K 7/20845* (2013.01)

(58) Field of Classification Search
CPC ..... B60H 1/00785; B60H 1/245; G06F 1/206; H05K 7/20845
USPC ................................................... 454/136–138
See application file for complete search history.

(56) References Cited

FOREIGN PATENT DOCUMENTS

| | | |
|---|---|---|
| CN | 102673383 A | 9/2012 |
| CN | 203438959 U | 2/2014 |
| CN | 103692881 A | 4/2014 |
| CN | 204754962 U | 11/2015 |
| CN | 205292233 U | 6/2016 |
| CN | 106848496 A | 6/2017 |
| CN | 206718917 U | 12/2017 |
| CN | 206758478 U | 12/2017 |
| CN | 107851865 A | 3/2018 |
| CN | 207165720 U | 3/2018 |
| CN | 108437747 A | 8/2018 |
| DE | 102014018774 A1 | 6/2016 |
| JP | 2010103218 A | 5/2010 |
| JP | 2018131046 A | 8/2018 |
| KR | 10-2015-0044874 | 4/2015 |

OTHER PUBLICATIONS

Office Action issued by the Chinese Patent Office dated Mar. 15, 2021.

*Primary Examiner* — Vivek K Shirsat
(74) *Attorney, Agent, or Firm* — IP & T Group LLP

(57) ABSTRACT

A cooling system for efficiently cooling large-scale data storage devices embedded in a vehicle, and a smart vehicle including the same are disclosed. The storage device cooling system includes a storage housing section located at a ceiling-mounted structure of a vehicle, provided with an indoor space thereof in which a plurality of storage devices is kept and an opening/closing device configured to open or close the indoor space, a sensing circuit configured to detect a temperature of the indoor space, and an opening/closing controller configured to control operations of the opening/closing device in response to the temperature detected by the sensing circuit.

19 Claims, 6 Drawing Sheets

SYSTEM FOR COOLING STORAGE DEVICE AND SMART VEHICLE INCLUDING THE SAME

CROSS-REFERENCE TO RELATED APPLICATION

This patent application claims priority under 35 U.S.C. § 119(a) to Korean patent application No. 10-2018-0120871 filed on 11 Oct. 2018, which is hereby incorporated in its entirety by reference.

The technology and implementations disclosed in this patent application relate to a smart vehicle, and more particularly to a smart vehicle provided with a cooling system capable of efficiently cooling large-scale data storage devices installed in the vehicle.

BACKGROUND

In recent times, with the rapid development of next-generation smart vehicles (e.g., autonomous vehicles) that are capable of supporting complicated applications based on a large amount of data while simultaneously using information communication technology, demand for data storage devices for use in next-generation smart vehicles is rapidly increasing.

Particularly, a cloud computing method for allowing a central sever to process target (objective) data needed for the autonomous vehicles from among a variety of methods for operating and managing the autonomous vehicles may have a high possibility of causing traffic accidents caused by network latency. Therefore, since driving and operation characteristics of such autonomous vehicles are generally directly associated with vehicle safety and stability, many developers and companies are conducting intensive research into edge computing technology in which at least one large-scale data storage device is located closer to a data processing device so that necessary data can be rapidly processed within the autonomous vehicles.

Moreover, in order to efficiently support user-friendly infotainment that occupies the most important application field from among vehicle-purposed semiconductor application fields, it is necessary for such large-scale data storage devices to be installed or embedded in vehicles.

Under the above-mentioned situation in which large-scale data storage devices are arranged in each vehicle, methods for efficiently arranging and managing the data storage devices to implement lower-power-consumption and lower-heating-power data storage devices are of importance to the operation and management of smart vehicles.

SUMMARY

This patent application provides designs of a storage device cooling system and a smart vehicle including the same that substantially obviate one or more problems due to the limitations and disadvantages of the related art.

An embodiment of the present disclosure relates to a cooling system for efficiently cooling large-scale data storage devices embedded in a vehicle, and a smart vehicle including the same.

In accordance with an aspect of the present disclosure, a storage device cooling system includes a storage housing section located at a ceiling-mounted structure of a vehicle, provided with an indoor space thereof in which a plurality of storage devices is kept and including an opening/closing device configured to open or close the indoor space, a sensing circuit configured to detect a temperature of the indoor space, and an opening/closing controller configured to control operations of the opening/closing device in response to the temperature detected by the sensing circuit.

In accordance with another embodiment, a smart vehicle includes a sensing circuit configured to detect information about a vehicle and peripheral situation information of the vehicle, a data processing circuit configured to control operations of the vehicle based on information detected by the sensing circuit and a preprogrammed algorithm, a plurality of storage devices configured to store data needed to operate the data processing circuit, a ceiling-mounted structure provided with an indoor space in which the plurality of storage devices is kept, and provided with an opening/closing device configured to open or close the indoor space, and an opening/closing controller configured to control operations of the opening/closing device based on information detected by the sensing circuit.

It is to be understood that both the foregoing general description and the following detailed description of embodiments are exemplary and explanatory.

BRIEF DESCRIPTION OF THE DRAWINGS

The above and other features and advantages of the disclosed technology will become readily apparent by reference to the following detailed description when considered in conjunction with the accompanying drawings wherein.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Figure 1:
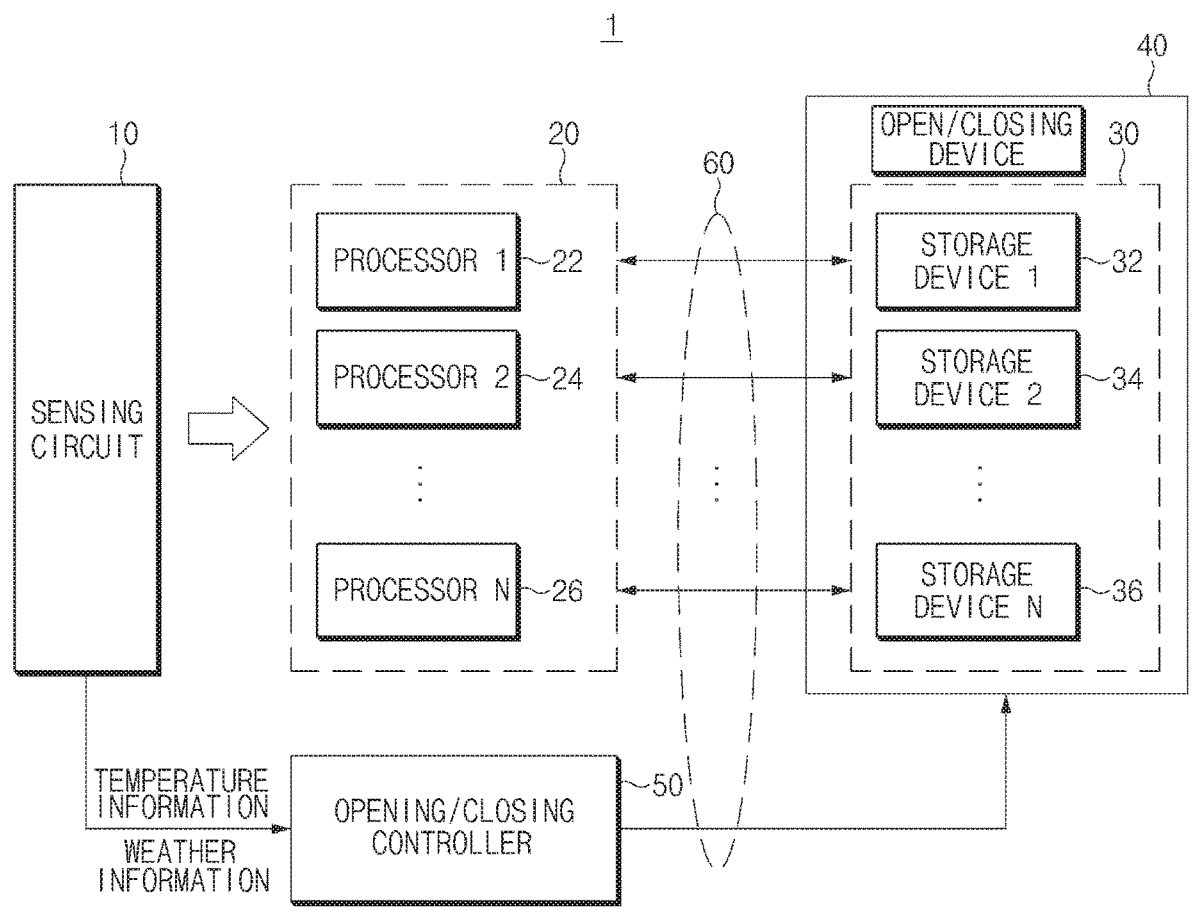
FIG. 1 is a block diagram illustrating an example of a smart vehicle in accordance with an embodiment of the disclosed technology.

FIG. 1 is a block diagram illustrating an example of a smart vehicle 1 in accordance with an embodiment of the disclosed technology.

Referring to FIG. 1, the smart vehicle 1 may include a sensing circuit 10, a data processing circuit 20, a data storage circuit 30, a storage housing section 40, and an opening/closing controller 50.

The sensing circuit 10 may sense or detect vehicle information about the vehicle 1 or vehicle peripheral information about surroundings of the vehicle 1, and may transmit the sensed (or detected) data to processors 22 to 26 contained in the data processing circuit 20. In this case, the vehicle information may include not only conditions and operation states of constituent elements contained in the vehicle 1, but also indoor state information (e.g., temperature, humidity, air-pollution, etc.) and driving information (e.g., driving speed, traveling direction, weight, braking distance, etc.) of the vehicle 1. The vehicle peripheral information may include external information of the vehicle 1 {for example, peripheral brightness, temperature, humidity, weather condition, position of the Sun, peripheral objects (pedestrians, other vehicles, road signs, etc.), road types, geographic features, information about the number of lanes, driving lane information} and various kinds of information needed for autonomous driving of the vehicle 1.

The sensing circuit 10 may include a camera (i.e., an image sensor), a collision sensor, a wheel sensor, a speed sensor, a gradient sensor, a weight sensor, a heading sensor, a yaw sensor, an acceleration sensor, a gyro sensor, a position module, a vehicle forward/reverse movement sensor, a battery sensor, a fuel sensor, a tire sensor, a steering sensor based on the rotation of a steering wheel, an in-vehicle temperature sensor, an in-vehicle humidity sensor, a rain sensor, an illumination sensor, a tire pressure sensor, an ultrasonic sensor, a radar sensor, a Light Detection And Ranging (LiDAR) sensor, and the like.

In particular, the sensing circuit 10 may detect an indoor temperature of the storage housing section 40, and may transmit the detected indoor temperature to the opening/closing controller 50. That is, the sensing circuit 10 may include a temperature sensor embedded in an indoor space of the storage housing section 40. The sensing circuit 10 may detect weather conditions of an outdoor space of the vehicle 1, and may transmit the detected outdoor weather information to the opening/closing controller 50.

The data processing circuit 20 may include a plurality of processors 22 to 26. Each of the processors 22 to 26 may control operations of various devices embedded in the smart vehicle 1 according to a preprogrammed algorithm. The processors 22 to 26 may include at least one processor capable of controlling various systems, for example, a Highway Driving Assist (HAD) system for autonomous driving, a Blind Spot Detection (BSD) system, an Electronic Parking Braking (EPB) system, an Autonomous Emergency Braking (AEB) system, a Lane Departure Warning System (LDWS), a Lane Keeping Assist System (LKAS), an Advanced Smart Cruise Control (ASCC) system, and a Traffic Jam Assist System (TJAS). In addition, the processors 22 to 26 may include at least one processor capable of controlling operations of an In-Vehicle Infotainment system.

The data storage circuit 30 may include a plurality of storage devices 32 to 36. The storage devices 32 to 36 may store data needed to operate the processors 22 to 26. The storage devices 32 to 36 may be coupled to the processors 22 to 26 through a data cable 60.

The storage devices 32 to 36 may include a volatile memory and a non-volatile memory. For example, the volatile memory may include a Dynamic Random Access Memory (DRAM) and a Static Random Access Memory (SRAM). The non-volatile memory may include a flash memory, a Phase Change Random Access Memory (PRAM), a Resistive Random Access Memory (RRAM), a Spin Transfer Torque Random Access Memory (STTRAM), a Magnetic Random Access Memory (MRAM), etc.

Specifically, the storage devices 32 to 36 in accordance with the embodiment may be collectively installed in a storage housing section 40, and the installation positions of the storage devices 32 to 36 within the storage housing section 40 may be determined according to types of stored data and usage rates of such stored data. For example, the storage devices, each of which stores high-usage-rate data, may be arranged at both sides of the storage housing section 40, the other storage devices, each of which stores low-usage-rate data, may be arranged at the center part of the storage housing section 40. In addition, storage devices configured to store data associated with a front part of the vehicle 1 (for example, data associated with a front sensor, an instrument panel, front wheels, a front bumper, and a driver-seat/passenger-seat infotainment) may be arranged at the front part of the storage housing section 40, and some storage devices configured to store data associated with a rear part of the vehicle 1 (for example, data associated with a rear sensor, rear wheels, a rear bumper, and a back-seat infotainment system) may be arranged at the rear part of the storage housing section 40, and other storage devices configured to store data associated with a side part of the vehicle 1 (for example, data associated with a side sensor and other data) may be arranged at the center of the storage housing section 40.

The storage devices 32 to 36 may be coupled to the processors 22 to 26. In this case, the data cable 60 configured to couple the storage devices 32 to 36 to the processors 22 to 26 may be arranged to pass through side frames of the smart vehicle 1.

The storage devices 32 to 36 contained in the storage housing section 40 may be coupled to one another, and the data storage circuit 30 may analyze data usage patterns of the respective processors 22 to 26 and may thus change the position of storing data according to the analyzed result. For example, when the processor 22 has a very low usage rate of data either at specific time zones or at specific places and the processor 22 has a high usage rate of data at ordinary times and any other place, the data storage circuit 30 may store data associated with the processor 22 in storage devices located at both sides of the storage housing section 40 at ordinary times, and may also store data associated with the processor 22 in another storage device located at the center part of the storage housing section 40 when at the specific time zones or at the specific places.

The storage devices 32 to 36 are physically fixed within the storage housing section 40 and the storage housing section 40 may provide a room for inner air circulation touching the storage devices 32 to 36. The storage housing section 40 may be a ceiling-mounted structure of the smart vehicle 1. Alternatively, the storage housing section 40 may be mounted to a ceiling-mounted structure of the smart vehicle 1. For example, the storage devices 32 to 36 are physically locked within the storage housing section 40 of the ceiling-mounted structure and there may be provided a room for inner air circulation flowing between and over the storage devices 32 to 36 within the storage housing section 40 of the ceiling-mounted structure.

The storage housing section 40 may include a plurality of opening/closing devices configured to provide air ventilation to the storage housing section 40 according to an outdoor-air circulation mode or an indoor-air circulation mode. The opening/closing devices may include an outdoor-air circulation opening/closing device and an indoor-air circulation opening/closing device. The outdoor-air circulation opening/closing device may provide air circulation between an external of the vehicle 1 and the storage housing section 40. The indoor-air circulation opening/closing device may selectively provide air circulation between the storage housing section 40 and an internal space of the vehicle 1. The outdoor-air circulation opening/closing device may include not only a first outdoor-air circulation opening/closing device formed at a front part of the ceiling-mounted structure of the vehicle 1 (i.e., the front side of the vehicle 1), but also a second outdoor-air circulation opening/closing device formed at a rear part of the ceiling-mounted structure of the vehicle 1 (i.e., the rear side of the vehicle 1). The indoor-air circulation opening/closing device may be provided at the bottom of the ceiling-mounted structure of the vehicle 1 such that the indoor-air circulation opening/closing device can face the indoor space of the vehicle 1. In addition, the storage housing section 40 may include at least one air filter to filter out foreign materials (e.g., tiny pebbles or insects) contained in outdoor air flowing from the external into the storage housing section 40 through the outdoor-air circulation opening/closing device.

The opening/closing controller 50 may receive information about an indoor temperature of the storage housing section 40 from the sensing circuit 10, and may control operations of the opening/closing device of the storage housing section 40 according to the received temperature information. For example, when the indoor temperature of the storage housing section 40 reaches a predetermined reference temperature, the opening/closing device 59 may cool the storage devices 32 to 36 by opening the opening/closing device of the storage housing section 40. In this case, the opening/closing controller 50 may adjust or control the amount of air (i.e., air volume) by adjusting or controlling the degree of opening of the opening/closing device according to a difference between the indoor temperature of the storage housing section 40 and the reference temperature. The opening/closing controller 50 may receive weather information (e.g., humidity information) from the sensing circuit 10, and may control the opening/closing device not only using the received weather information but also using the temperature information of the storage housing section 40.

For example, when the indoor temperature of the storage housing section 40 reaches a predetermined reference temperature, the opening/closing controller 50 may selectively operate the outdoor-air circulation opening/closing device or the indoor-air circulation opening/closing device according to such weather information. In more detail, the opening/closing controller 50 may control the outdoor-air circulation opening/closing device at ordinary times, such that the opening/closing controller 50 can cool the storage devices 32 to 36 using outdoor air. Alternatively, in rainy or snowy weather conditions, the opening/closing controller 50 may control the indoor-air circulation opening/closing such that the opening/closing controller 50 can cool the storage devices 32 to 36 using indoor air of the vehicle 1.

Although the weather information may be detectable by the sensing circuit 10 as described above, it should be noted that the weather information may also be received from an external server through wireless communication.

Figure 2:
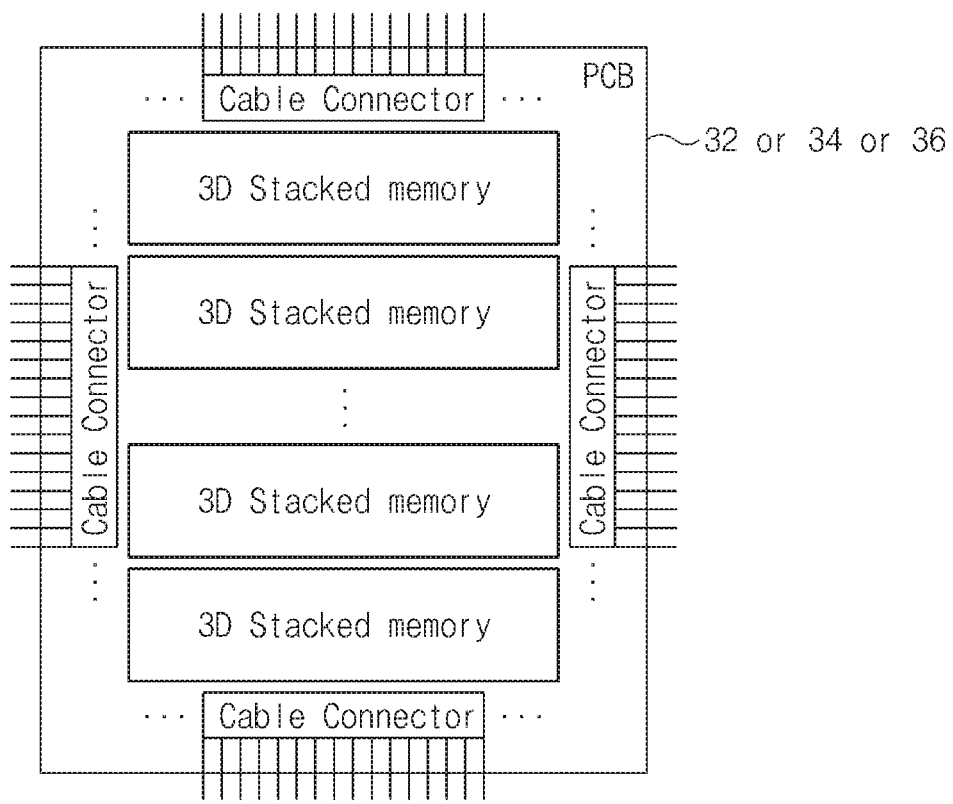
FIG. 2 is a schematic diagram illustrating exemplary implementation of storage devices shown in FIG. 1 in accordance with an embodiment of the disclosed technology.

FIG. 2 is a schematic diagram illustrating the storage devices 32 to 36 shown in FIG. 1 in accordance with an embodiment of the disclosed technology.

Referring to FIG. 2, each of the storage devices 32 to 36 may be formed as a stacked structure of a plurality of memories (i.e., volatile memories and/or non-volatile memories) on a Printed Circuit Board (PCB). That is, the plurality of memories may be stacked over the PCB, resulting in formation of the storage devices 32 to 36.

Cable connectors coupled to data cables 60 may be located at the PCB, and the storage devices 32 to 36 may be coupled to the processors 22 to 26 through the data cables 60 or may be coupled to other contiguous storage devices within the storage housing section 40.

Figure 3A:
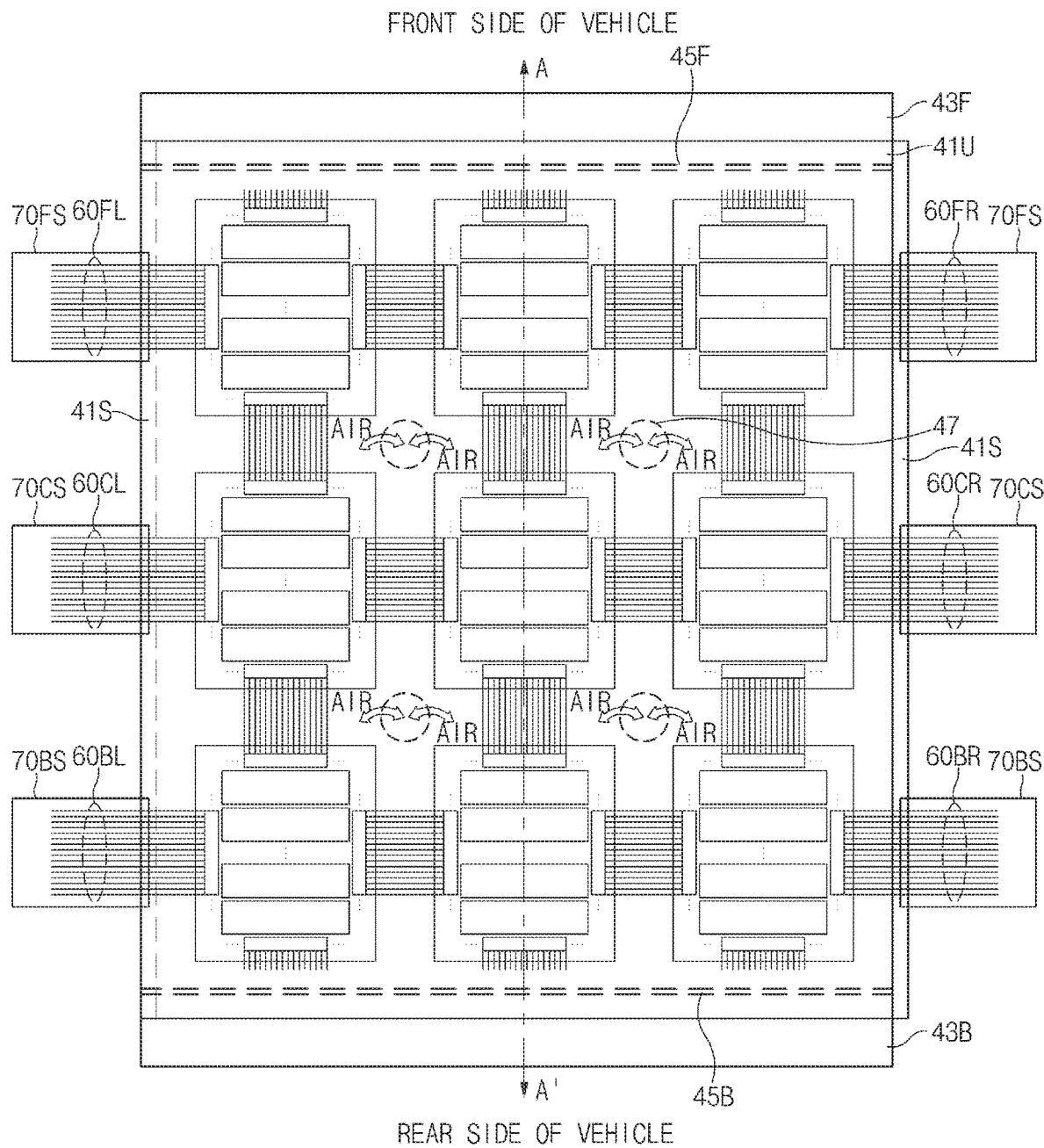
FIG. 3A is a plane view illustrating an example of the external appearance of storage devices kept in a storage housing section in accordance with an embodiment of the disclosed technology.
Figure 3B:
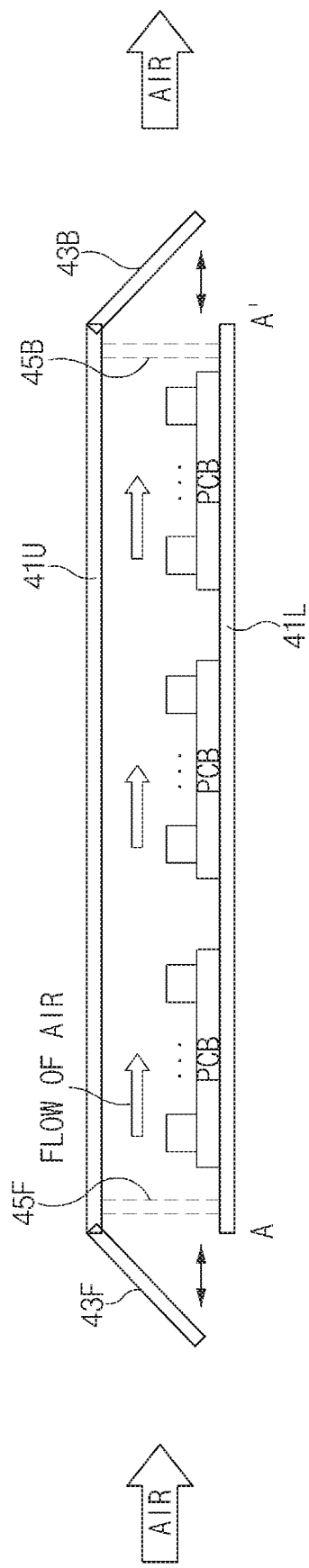
FIG. 3B is a cross-sectional view illustrating arrangement of storage devices taken along the line A-A' shown in FIG. 3A.

FIG. 3A is a plane view illustrating an example of the external appearance of storage devices kept in the storage housing section 40 in accordance with an embodiment of the disclosed technology. FIG. 3B is a cross-sectional view illustrating the storage devices 32 to 36 taken along the line A-A' shown in FIG. 3A.

Referring to FIGS. 3A and 3B, the storage housing section 40 may include a bottom surface 41L, a top surface 41U, and two side surfaces 41S. The bottom surface 41L and the top surface 41U may be vertically spaced apart from each other by a predetermined distance. Two side surfaces 41S may be formed as barriers that are provided at both sides located between the bottom surface 41L and the top surface 41U, such that the bottom surface 41L can be coupled to the top surface 41U. In this case, the bottom surface 41L of the storage housing section 40 may be an inner ceiling of the vehicle 1.

One outdoor-air circulation opening/closing device 43F configured to selectively open or close the space between the external part of the vehicle 1 and the indoor space of the storage housing section 40 may be arranged at a front side of the storage housing section 40, and the other outdoor-air circulation opening/closing 43B configured to selectively open or close the space between the external part of the vehicle 1 and the indoor space of the storage housing section 40 may be arranged at a rear side of the storage housing section 40.

As illustrated in FIG. 3B, the outdoor-air circulation opening/closing devices 43F and 43B may operate to open a lower portion of the front side and the rear side of the storage housing section 40 in response to movement of a chain-shaped reciprocating motor (not shown).

The opening/closing operation of the outdoor-air circulation opening/closing devices 43F and 43B may be controlled by the opening/closing controller 50. The opening/closing controller 50 may allow each of the outdoor-air circulation opening/closing devices 43F and 43B to be opened by a predetermined angle in response to the indoor temperature of the storage housing section 40, such that the opening/closing controller 50 may adjust or control the amount of air flowing into the storage housing section 40.

An indoor-air circulation opening/closing device 47 may be located at the bottom surface 41L of the storage housing section 40, such that the indoor-air circulation opening/closing device 47 can open or close an air path between the indoor space of the storage housing section 40 and the indoor space of the vehicle 1. The indoor-air circulation opening/closing device 47 may be opened or closed in the same manner as in a slidable door, and the indoor-air circulation opening/closing device 47 may also be controlled by the opening/closing controller 50. The opening/closing controller 50 may control the indoor-air circulation opening/closing device 47 not only based on the indoor temperature of the storage housing section 40 but also based on external weather conditions of the vehicle 1. For example, although the indoor temperature of the storage housing section 40 is higher than the reference temperature, if rainy or snowy weather conditions occur or if outdoor-air humidity is higher than reference humidity, the opening/closing controller 50 may open the indoor-air circulation opening/closing device 47 without operating the outdoor-air circulation opening/closing devices 43F and 43B, such that indoor air of the vehicle 1 can flow into the storage housing section 40.

That is, when the weather condition is not good (e.g., rain, snow, and high humidity), the opening/closing controller 50 may allow indoor air of the vehicle 1 to flow into the storage housing section 40 such that the storage devices 32 to 36 can be cooled (i.e., indoor-air circulation mode). Alternatively, when the weather condition is considered good, the opening/closing controller 50 may allow outdoor air of the vehicle 1 to flow into the storage housing section 40 such that the storage devices 32 to 36 can be cooled (i.e., outdoor-air circulation mode). In the indoor-air circulation mode, the opening/closing controller 50 may operate an air-conditioner by interacting with the processor 22 to 26 capable of controlling the air-conditioner, such that cold air cooled by the air-conditioner may also flow into the storage housing section 40 as necessary.

Filters 45F and 45B configured to prevent foreign materials from flowing into the storage housing section 40 through the outdoor-air circulation opening/closing devices 43F and 43B may be respectively located at front and rear sides of the storage housing section 40. As a result, when outdoor air flows into the storage housing section 40 through the outdoor-air circulation opening/closing devices 43F and 43B, the filters 45F and 45B may prevent unexpected foreign materials from unexpectedly flowing into the storage housing section 40.

Data cables 60FL, 60FR, 60CL, 60CR, 60BL and 60BR through which the storage devices 32 to 36 are coupled to the processors 22 to 26 may be installed to pass through side frames 70FS, 70CS, and 70BS located closest to the corresponding storage devices 32 to 36.

Figure 4:
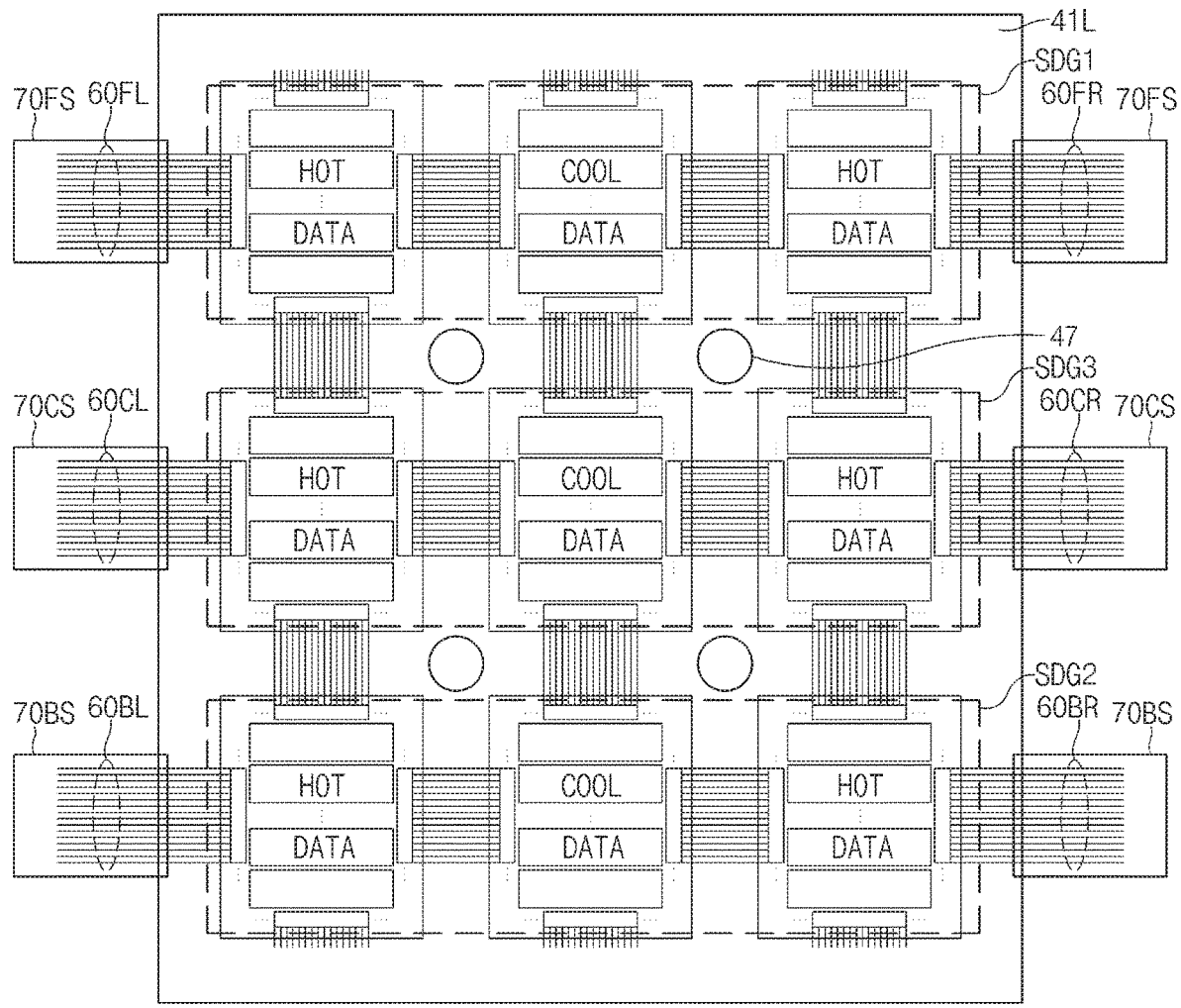
FIG. 4 is a schematic diagram illustrating an example of a layout structure of storage devices in accordance with an embodiment of the disclosed technology.

FIG. 4 is a schematic diagram illustrating an example of a layout structure of storage devices 32 to 36 in accordance with an embodiment of the disclosed technology.

Referring to FIG. 4, the storage devices 32 to 36 may be spaced apart from one another by a predetermined distance, such that the storage devices 32 to 36 may be arranged in an array shape. The storage devices 32 to 36 may be fixed to the bottom surface 41 of the storage housing section 40. The storage devices 32 to 36 may be coupled to other contiguous storage devices through data cables. The storage devices 32 to 36 may be grouped and arranged according to types of stored data and usage rates of such stored data.

For example, a group SDG1 of storage devices capable of storing data associated with the front part of the vehicle 1 (for example, data associated with a front sensor, an instrument panel, front wheels, a front bumper, and a driver-seat/passenger-seat infotainment system) may be arranged at a front part of the storage housing section 40 (i.e., a front side of the vehicle 1). A group SDG2 of other storage devices configured to store data associated with the rear part of the vehicle 1 (for example, data associated with a rear sensor, rear wheels, a rear bumper, and a back-seat infotainment) may be arranged at a rear side of the storage housing section 40 (i.e., a rear side of the vehicle 1). In addition, a group SDG3 of some other storage devices configured to store data associated with a side part of the vehicle 1 (for example, data associated with a side sensor and other data) may be arranged at the center part of the storage housing section 40 (i.e., the space between the group SDG1 and the group SDG2).

In each of the storage device groups SDG1 to SDG3, the hot storage devices configured to store hot data HOT DATA, a usage rate of which is higher than a predetermined reference usage rate, may be arranged at both side parts of the storage housing section 40, and other cool storage devices configured to store cool data COOL DATA, a usage rate of which is lower than the predetermined reference usage rate, may be arranged at the center part of the storage housing section 40. That is, the storage devices, each of which stores high-usage-rate data HOT DATA, may be arranged in a manner that a distance (i.e., data-cable length) to the respective processors 22 to 26 can be minimized.

In addition, the data storage circuit 30 may analyze a data usage pattern of each processor 22 to 26, such that the data storage circuit 30 may move stored data between the storage devices according to the analyzed result of each processor 22 to 26. For example, when the processor 22 has a very low usage rate of data either at specific time zones or at specific places and when the processor 22 has a high usage rate of data at ordinary times, the data storage circuit 30 may store data associated with the processor 22 in some storage devices, each of which stores a high-usage-rate data HOT DATA at ordinary times, and may also store data associated with the processor 22 in some other storage device at the specific time zones or at the specific corresponding places.

The storage devices, each of which stores high-usage-rate data HOT DATA, may be coupled to the processors 22 to 26 through data cables 60FL, 60FR, 60CL, 60CR, 60BL, and 60BR. In this case, the data cables 60FL, 60FR, 60CL, 60CR, 60BL, and 60BR may be coupled to the processors 22 to 26 after passing through side frames 70FS, 70CS, and 70BS of the smart vehicle 1.

Figures 5A, 5B:
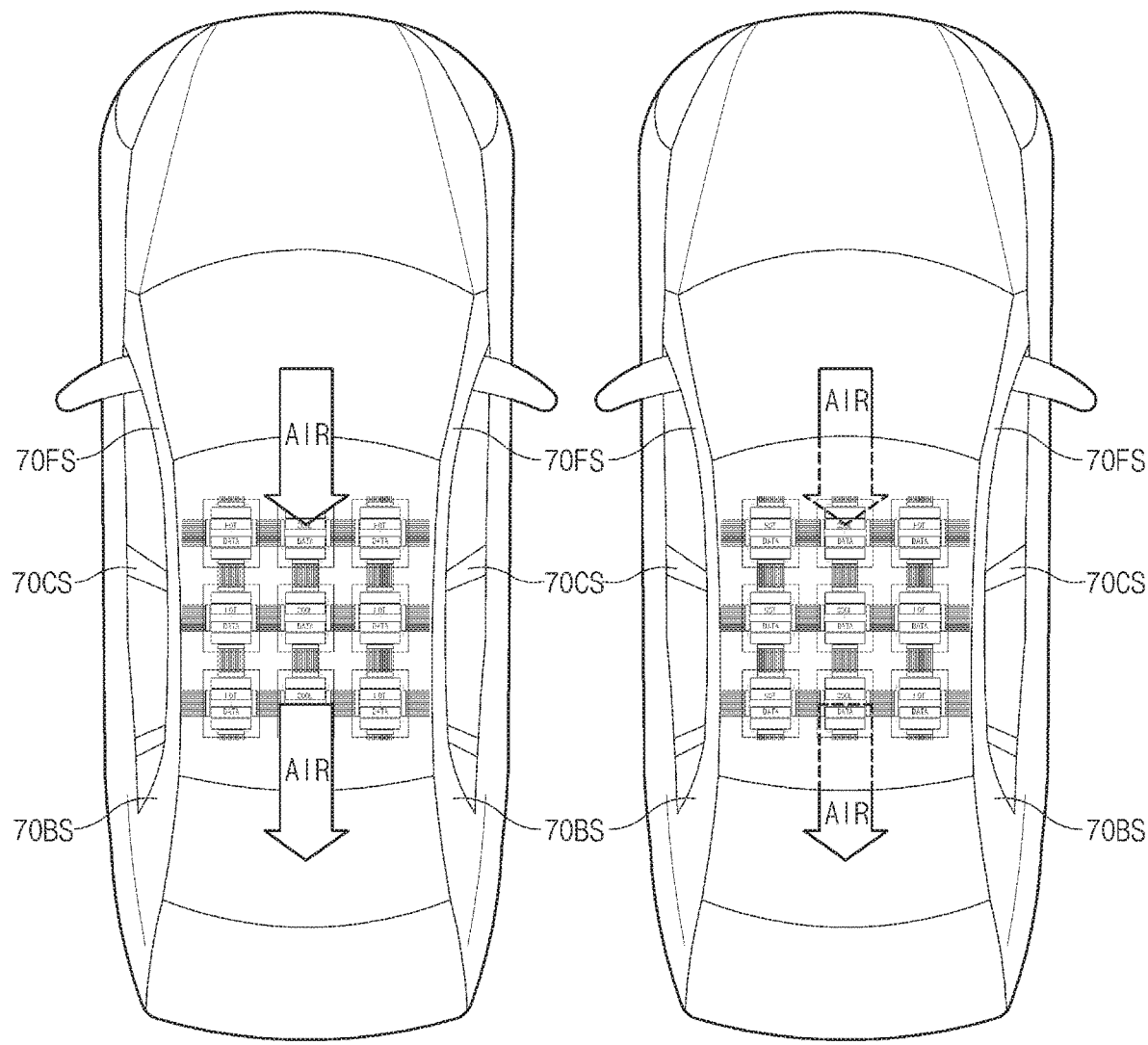
FIG. 5A is a view illustrating an example of air flow formed when an outdoor-air circulation opening/closing device of a storage housing section is closed in accordance with an embodiment of the disclosed technology.
FIG. 5B is a view illustrating an example of air flow formed when an outdoor-air circulation opening/closing device of a storage housing section is open in accordance with an embodiment of the disclosed technology.

FIGS. 5A and 5B are views illustrating appearance of the storage devices mounted to the ceiling-mounted structure of the smart vehicle 1 in accordance with an embodiment of the disclosed technology. In more detail, FIG. 5A is a view illustrating an example of air flow formed when the outdoor-air circulation opening/closing device of the storage housing section is closed, and FIG. 5B is a view illustrating an example of air flow formed when the outdoor-air circulation opening/closing device of the storage housing section is open.

Referring to FIGS. 5A and 5B, the sensing circuit 10 may periodically detect an indoor temperature of the storage housing section 40 disposed on the ceiling of the vehicle 1, and may transmit the detected temperature information to the opening/closing controller 50. In addition, the sensing circuit 10 may detect outdoor weather conditions of the vehicle 1, and may also transmit the detected weather information to the opening/closing 50.

The opening/closing controller 50 may control the opening/closing operation of the outdoor-air circulation opening/closing devices 43F and 43B and the indoor-air circulation opening/closing device 47 according to temperature and weather information received from the sensing circuit 10.

For example, when a temperature of the storage housing section 40 disposed on the ceiling of the vehicle 1 is lower than a reference temperature, the opening/closing controller 50 may close both the indoor-air circulation opening/closing device 47 and the outdoor-air circulation opening/closing devices 43F and 43B, such that the opening/closing controller 50 may prevent outdoor air of the vehicle 1 from flowing into the storage housing section 40 as shown in FIG. 5A.

If a temperature of the storage housing section 40 is equal to or higher than the reference temperature, the opening/closing controller 50 may confirm outdoor weather conditions of the vehicle 1 using the received weather information.

Based on the weather information, when the outdoor weather condition of the vehicle 1 is rainy or snowy weather or is at a very high humidity condition, the opening/closing device 70 may close the outdoor-air circulation opening/closing devices 43F and 43B and open the indoor-air circulation opening/closing device 47. As a result, indoor air of the vehicle 1 may flow into or out of the storage housing section 40, such that the storage devices 32 to 36 may be cooled.

On the other hand, when the outdoor weather condition of the vehicle 1 is considered good, the opening/closing controller 50 may close the indoor-air circulation opening/closing device 47 and open the outdoor-air circulation opening/closing devices 43F and 43B. As a result, as shown in FIG. 5B, the outdoor air of the vehicle 1 flows into the storage housing section 40 through the front part of the storage housing section 40, and then flows out through the rear part of the storage housing section 40, such that the storage devices 32 to 36 may be cooled.

In this case, foreign materials contained in the outdoor air may be filtered out by the filter 45 mounted to the storage housing section 40.

The opening/closing controller 50 may adjust or control the degree of opening of the outdoor-air circulation opening/closing devices 43F and 43B according to a difference between the detected current temperature and the reference temperature.

As is apparent from the above description, the cooling system and the smart vehicle 1 including the same in accordance with the embodiments of the present disclosure may rapidly cool large-scale storage devices embedded in the vehicle 1, resulting in implementation of low-power-consumption and low-heating-power data storage devices.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Furthermore, all changes coming within the meaning and equivalency range of the appended claims are intended to be embraced therein. In addition, it is obvious to those skilled in the art that claims that are not explicitly referenced by each other in the appended claims may be presented in combination as another embodiment or included as a new claim by subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A storage device cooling system comprising:
    a storage housing section located at a ceiling-mounted structure of a vehicle, provided with an indoor space thereof in which a plurality of storage devices is kept and including an opening/closing device configured to open or close the indoor space;
    a sensing circuit configured to detect a temperature of the indoor space; and
    an opening/closing controller configured to control operations of the opening/closing device in response to the temperature detected by the sensing circuit,
    wherein the plurality of storage devices is classified and arranged according to types of stored data and usage rates of the stored data.

2. The storage device cooling system according to claim 1, wherein the opening/closing device includes:
    an outdoor-air circulation opening/closing device configured to allow outdoor air of the vehicle to flow into the indoor space of the storage housing section; and
    an indoor-air circulation opening/closing device configured to allow indoor air of the vehicle to flow into the indoor space of the storage housing section.

3. The storage device cooling system according to claim 2, wherein the outdoor-air circulation opening/closing device includes:
    a first outdoor-air circulation opening/closing device installed at a front side of the vehicle; and
    a second outdoor-air circulation opening/closing device installed at a rear side of the vehicle.

4. The storage device cooling system according to claim 2, wherein the indoor-air circulation opening/closing device is installed at a bottom surface of the storage housing section.

5. The storage device cooling system according to claim 2, wherein when the temperature detected by the sensing circuit is higher than a reference temperature, the opening/closing controller is configured to open the outdoor-air circulation opening/closing device or the indoor-air circulation opening/closing device.

6. The storage device cooling system according to claim 5, wherein the sensing circuit is configured to further detect an outdoor weather condition of the vehicle.

7. The storage device cooling system according to claim 6, wherein, when the outdoor weather condition detected by the sensing circuit indicates occurrence of rainy or snowy weather in an outdoor space of the vehicle or occurrence of a high-humidity outdoor air higher than a predetermined reference humidity in the outdoor space of the vehicle, the opening/closing controller closes the outdoor-air circulation opening/closing device and opens the indoor-air circulation opening/closing device.

8. The storage device cooling system according to claim 7, wherein, when the outdoor weather condition detected by the sensing circuit indicates non-occurrence of rainy or snowy weather in the outdoor space of the vehicle or indicates that an outdoor-air humidity of the vehicle is less than the reference humidity, the opening/closing controller closes the indoor-air circulation opening/closing device and opens the outdoor-air circulation opening/closing device.

9. The storage device cooling system according to claim 1, wherein the plurality of storage devices includes:
    a first storage device group arranged at a front side of the vehicle within the storage housing section, and configured to store data associated with the front part of the vehicle;
    a second storage device group arranged at a rear side of the vehicle within the storage housing section, and configured to store data associated with the rear part of the vehicle; and
    a third storage device group arranged between the first storage device group and the second storage device within the storage housing section, and configured to store data associated with a side part of the vehicle.

10. The storage device cooling system according to claim 9, wherein each of the first to third storage device groups includes:
- a plurality of hot storage devices arranged at both side parts within a corresponding storage device group, each of which is configured to store a high-usage-rate data, a usage rate of which is higher than a predetermined reference usage rate; and
- a cool storage device arranged between the hot storage devices within a corresponding storage device group, and configured to store low-usage-rate data, a usage rate of which is lower than the reference usage rate.

11. A smart vehicle comprising:
- a sensing circuit configured to detect information about a vehicle and peripheral information of the vehicle;
- a data processing circuit configured to control operations of the vehicle based on information detected by the sensing circuit and a preprogrammed algorithm;
- a plurality of storage devices configured to store data needed to operate the data processing circuit;
- a ceiling-mounted structure provided with an indoor space in which the plurality of storage devices is kept, and including an opening/closing device configured to open or close the indoor space; and
- an opening/closing controller configured to control operations of the opening/closing device based on information detected by the sensing circuit.

12. The smart vehicle according to claim 11, wherein the opening/closing device includes:
- an outdoor-air circulation opening/closing device configured to allow outdoor air of the vehicle to flow into the indoor space of the ceiling-mounted structure; and
- an indoor-air circulation opening/closing device configured to allow indoor air of the vehicle to flow into the indoor space of the ceiling-mounted structure.

13. The smart vehicle according to claim 12, wherein the sensing circuit is configured to detect a temperature of the indoor space of the ceiling-mounted structure and an outdoor weather condition of the vehicle.

14. The smart vehicle according to claim 13, wherein, when the result detected by the sensing circuit indicates that a temperature of the indoor space of the ceiling-mounted structure is higher than a predetermined reference temperature and also indicates a presence of rainy or snowy weather in the outdoor space of the vehicle or a presence of a high-humidity condition higher than a predetermined reference humidity in the outdoor space of the vehicle, the opening/closing controller closes the outdoor-air circulation opening/closing device and opens the indoor-air circulation opening/closing device.

15. The smart vehicle according to claim 14, wherein, when the temperature of the indoor space of the ceiling-mounted structure is higher than the reference temperature, and when non-occurrence of rainy or snowy weather in the outdoor space of the vehicle or non-occurrence of a high-humidity outdoor air higher than the reference humidity in the outdoor space of the vehicle are detected, the opening/closing controller closes the indoor-air circulation opening/closing device and opens the outdoor-air circulation opening/closing device.

16. The smart vehicle according to claim 11, wherein the plurality of storage devices is classified and arranged according to types of stored data and usage rates of the stored data.

17. The smart vehicle according to claim 16, wherein the plurality of storage devices includes:
- a first storage device group arranged at a front side of the vehicle within the ceiling-mounted structure, and configured to store data associated with the front side of the vehicle;
- a second storage device group arranged at a rear side of the vehicle within the ceiling-mounted structure, and configured to store data associated with the rear side of the vehicle; and
- a third storage device group arranged between the first storage device group and the second storage device within the ceiling-mounted structure, and configured to store data associated with a side part of the vehicle.

18. The smart vehicle according to claim 17, wherein each of the first to third storage device groups includes:
- a plurality of hot storage devices arranged at both side parts within a corresponding storage device group, each of which is configured to store a high-usage-rate data, a usage rate of which is equal to or higher than a predetermined reference usage rate; and
- a cool storage device arranged between the hot storage devices within a corresponding storage device group, and configured to store low-usage-rate data, a usage rate of which is lower than the reference usage rate.

19. A storage system for a vehicle, the storage system comprising:
- an array of memory devices;
- a housing unit configured to accommodate the memory devices with a room for air ventilation and fixed to a ceiling of the vehicle;
- a sensing unit configured to sense inner and outer temperatures, and outer weather conditions of the vehicle; and
- a ventilating unit configured to open and shut, according to the sensed temperatures and weather conditions, one or more of an air paths between an outside of the vehicle and the housing unit, and an air path between an inside of the vehicle and the housing unit, thereby cooling the memory devices.

* * * * *